(12) United States Patent
Brenneise

(10) Patent No.: US 6,169,760 B1
(45) Date of Patent: Jan. 2, 2001

(54) FAST, HIGHLY ACCURATE FREQUENCY MEASUREMENT TECHNIQUE

(75) Inventor: Clark D. Brenneise, Moorpark, CA (US)

(73) Assignee: Hughes Electronics Corporation, El Segundo, CA (US)

(*) Notice: Under 35 U.S.C. 154(b), the term of this patent shall be extended for 0 days.

(21) Appl. No.: 09/044,630

(22) Filed: Mar. 19, 1998

(51) Int. Cl.[7] .............................. A61F 2/06; H04L 27/30
(52) U.S. Cl. ..................... 375/132; 375/224; 708/309
(58) Field of Search ........................... 375/132, 213, 375/224, 226, 228, 377; 455/226.1, 226.4; 379/5, 24; 370/241; 708/309, 300

(56) References Cited

U.S. PATENT DOCUMENTS

| | | | |
|---|---|---|---|
| 4,302,712 | * | 11/1981 | Pritchard . |
| 4,694,466 | * | 9/1987 | Kadin . |
| 4,810,960 | * | 3/1989 | Owen et al. . |

* cited by examiner

Primary Examiner—Chi H. Pham
Assistant Examiner—Jean Beth Corrielus
(74) Attorney, Agent, or Firm—Terje Gudmestad

(57) ABSTRACT

The frequency of a signal is determined using a signal filter having a signal filter skirt band frequency range wherein an intermediate fraction of an initial amplitude of an introduced signal passes through the signal filter. The magnitude of the transmitted intermediate fraction varies with the frequency of the introduced signal. A test applied signal having a frequency which lies within the signal filter skirt band frequency range is introduced into the signal filter. The transmitted amplitude of the test applied signal is measured after the test applied signal has passed through the signal filter. The transmitted amplitude is utilized as an indicator of the frequency of the test applied signal, either directly or through a calibration relation for amplitude as a function of frequency in the signal filter skirt band frequency range.

20 Claims, 6 Drawing Sheets

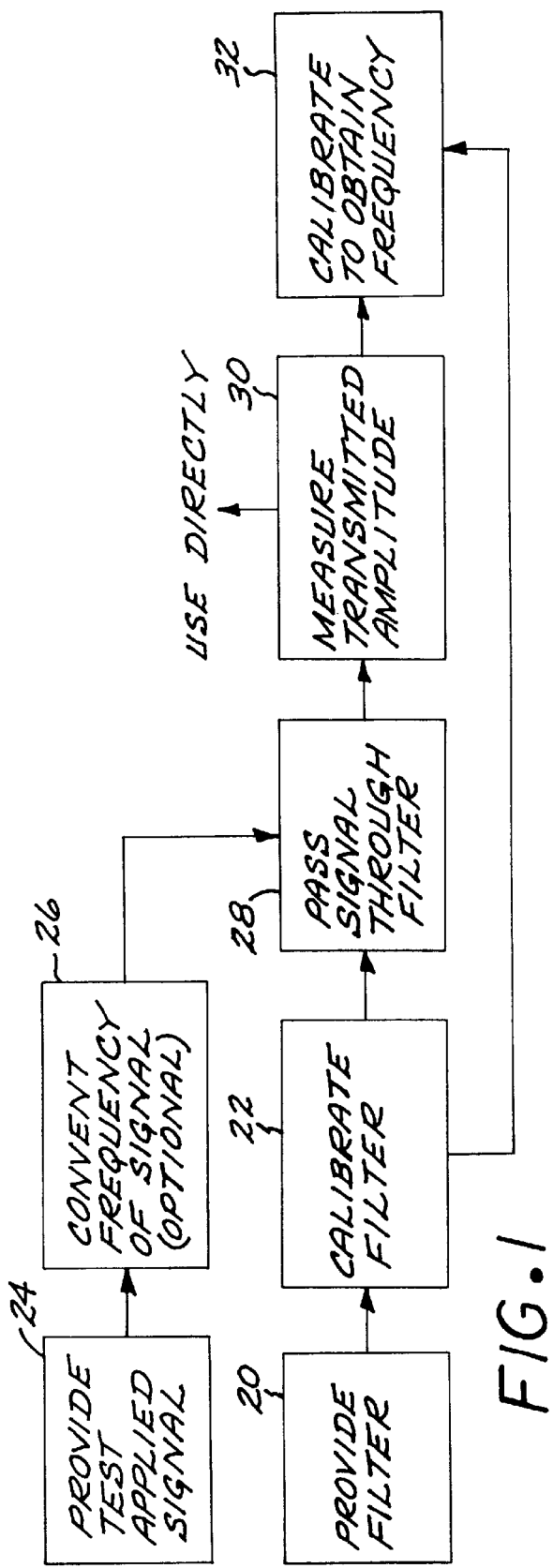
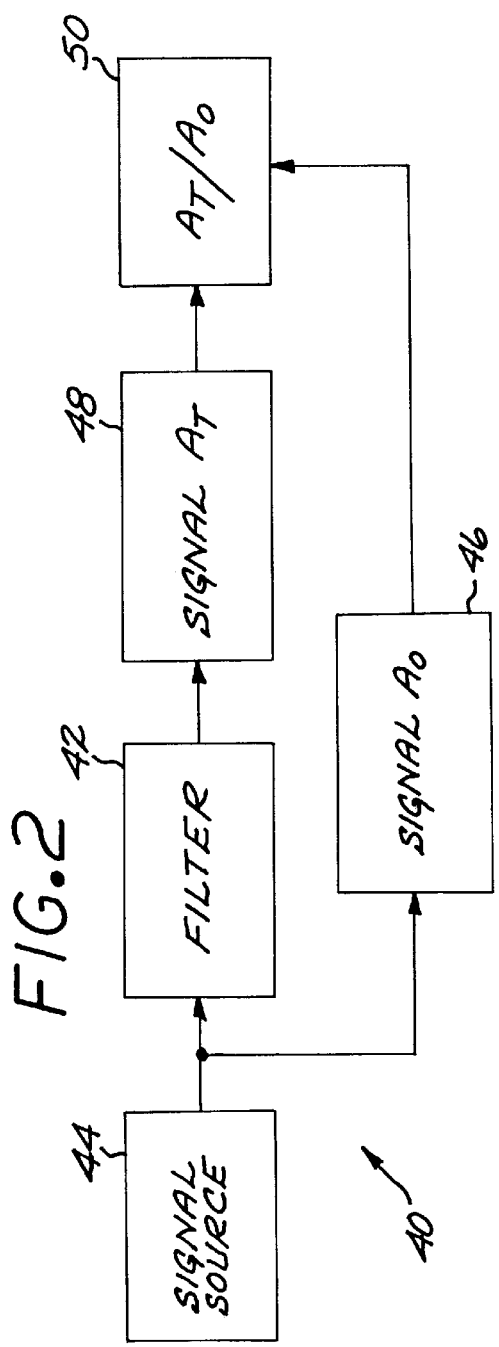
FIG. 1
FIG. 2

FAST, HIGHLY ACCURATE FREQUENCY MEASUREMENT TECHNIQUE

BACKGROUND OF THE INVENTION

This invention was made with Government support. The Government has certain rights in this invention.

This invention relates to the measurement of the frequency of a signal, and, more particularly, to a technique which functions very rapidly and with great accuracy.

It is often necessary to determine the frequency of an electrical signal. In the best-known approach to frequency measurement, the number of zero-crossings of a periodic signal occurring in a fixed sampling period of time is counted and converted to a frequency value. The longer the sampling period, the greater the accuracy of the frequency value. This technique works well if the available sampling period is longer than at least several cycles of the periodic signal. In other circumstances, however, the zero-crossing technique has shortcomings.

For example, frequency hopping signal synthesizers are used in a number of applications such as frequency-hopping spread spectrum communications. In this approach, the output frequency of the signal synthesizer whose signal carries information is varied rapidly between preselected or randomly selected frequencies. The signal synthesizer must accurately transmit at the desired frequency, and it is therefore important to be able to measure whether the output signal of the signal synthesizer is actually at the desired frequency or has drifted away.

In fast frequency hopping applications, the output signal does not dwell at any one frequency for a sufficiently long period of time to utilize the zero-crossing technique effectively to obtain real time, highly accurate measurements of the actual frequency output value. Some available test equipment can record the output signal for a period of time and download it for subsequent processing and analysis. This approach does not give real time information and, in addition, signal recording is suspended during the downloading period.

There is a need for an improved technique for accurately finding the frequency of a signal in real time and with a very short observation time. The present invention fulfills this need, and further provides related advantages.

SUMMARY OF THE INVENTION

The present invention provides a technique for finding the frequency of a signal in real time, with high accuracy. The required observation time to determine the frequency is quite short. Signal frequency determination is continuous, with no gaps in the data.

In accordance with the invention, a method for finding the frequency of a signal comprises providing a signal filter having, as a function of frequency, a signal pass band frequency range wherein a high fraction of an initial amplitude of an introduced signal passes through the signal filter, a signal stop band frequency range wherein a low fraction of an initial amplitude of an introduced signal passes through the signal filter, and a signal filter skirt band frequency range between the signal pass band and the signal stop band, wherein an intermediate fraction of an initial amplitude of an introduced signal passes through the signal filter. In the signal filter skirt band frequency range, the intermediate fraction varies with the frequency of the introduced signal.

A test applied signal is introduced into the signal filter. The test applied signal has a frequency which lies within the signal filter skirt band frequency range. If an initial test signal has a frequency which is not within the signal filter skirt band frequency range, it may be converted to that required frequency range by known up-converting or down-converting techniques. The transmitted amplitude of the test applied signal is measured after the test applied signal has passed through the signal filter, and is utilized as a measure of the frequency of the test applied signal. The transmitted amplitude may be used directly, or converted to a frequency value using a calibration of the filter that relates the transmitted amplitude of the signal applied to the signal filter to the frequency of the signal.

The present approach requires only a very short sampling or observation time of the signal to make accurate measurements of the frequency of the signal. Determinations of frequencies in the gigahertz range to within about ±50 Hertz, made in a measurement period of 50 microseconds, have been demonstrated. By comparison, available commercial test equipment achieves accuracies of about ±5000 Hertz in the same 50 microsecond sampling period. The present approach achieves two orders of magnitude improvement in accuracy of the measurement.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 1 is a block flow diagram of a preferred approach for practicing the invention;

FIG. 2 is a block diagram of a first apparatus for practicing the present invention;

DETAILED DESCRIPTION OF THE INVENTION

Figure 3A:
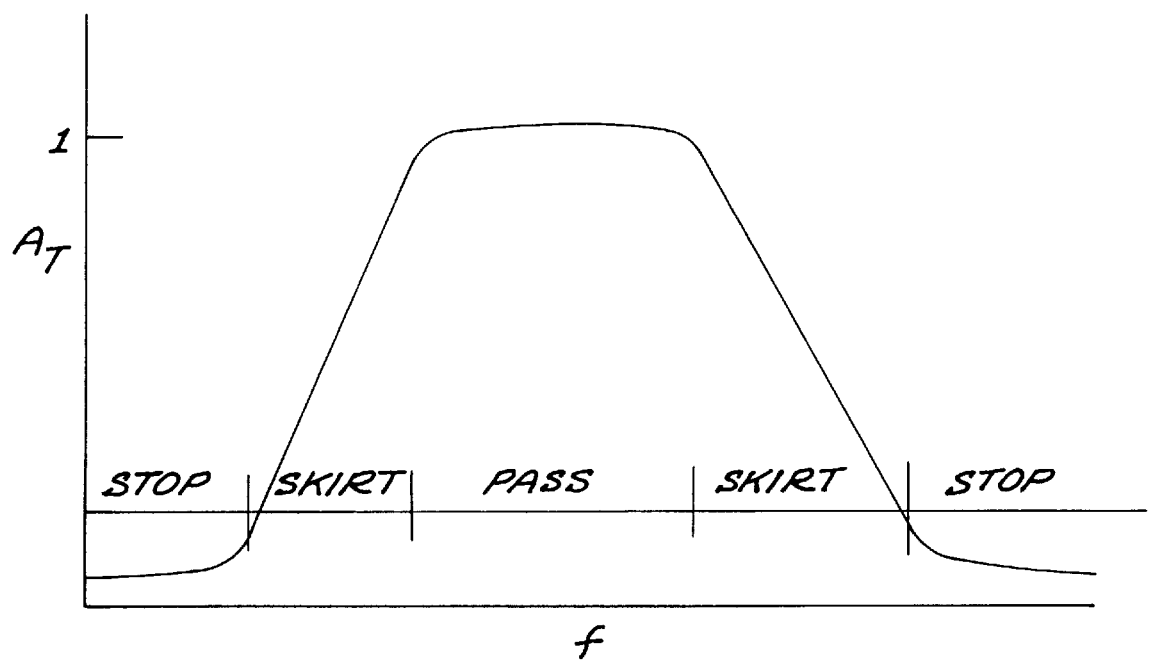
FIGS. 3A–3D are graphs of filter response properties.
Figure 3B:
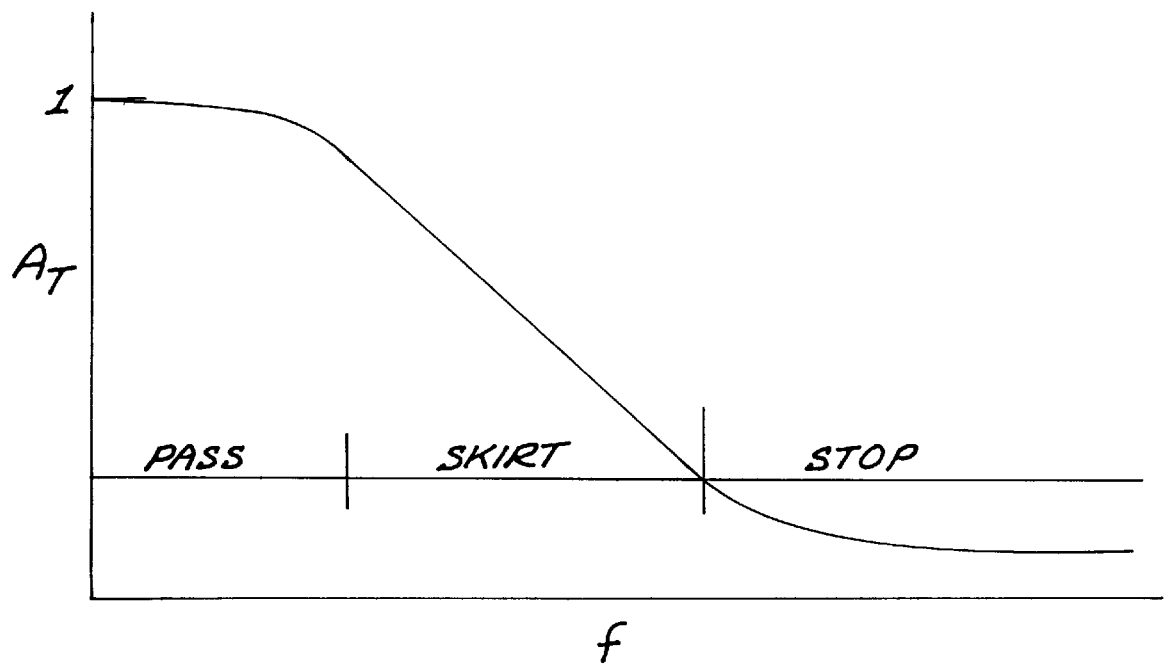
Figure 3C:
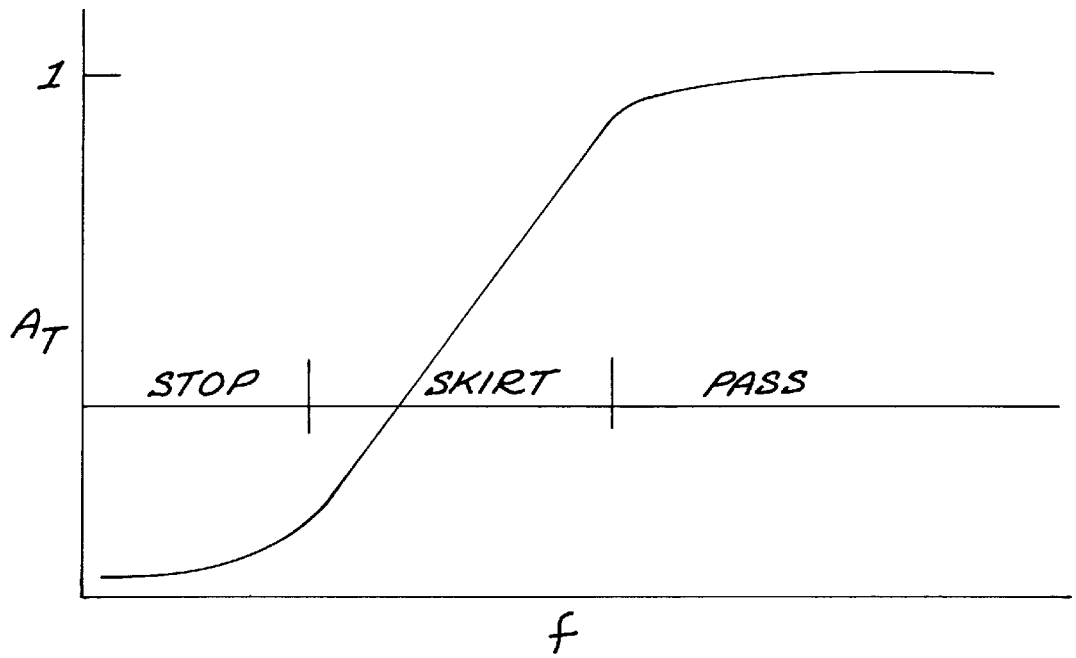
Figure 3D:
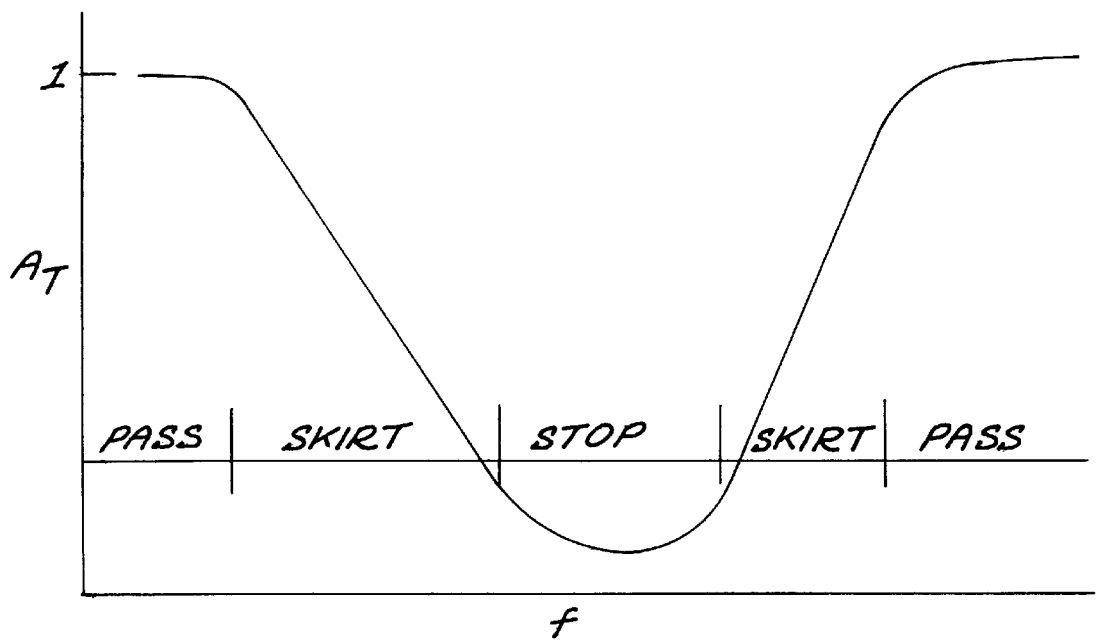

FIG. 1 illustrates a preferred approach for practicing the invention, and FIG. 2 depicts the functional structure of an apparatus 40 used in this approach. A signal filter 42 is provided, numeral 20. The signal filter 42 is a known type of device which normally includes inductors and capacitors configured to pass a selected band of frequencies and block another band of frequencies. That is, the signal filter 42 has a characteristic wherein the amplitude of the passed signal is a function of the input frequency of the signal. FIGS. 3A–3D illustrate the transmitted relative amplitude (normalized to an input amplitude of 1) versus frequency characteristics of the four most common types of signal filters. In each case, there is a signal band pass range wherein a high fraction of an initial amplitude of an introduced signal passes through the signal filter, a signal stop band frequency range wherein a low fraction of an initial amplitude of an introduced signal passes through the signal filter, and a signal filter "skirt" (the term of art) band frequency range between the signal pass band and the signal stop band, wherein an intermediate fraction of an initial amplitude of an introduced signal passes through the signal filter. These regions are marked for the case of a band pass filter (FIG. 3A), a low pass filter (FIG. 3B), a high pass filter (FIG. 3C), and a band reject filter (FIG. 3D). Although the specific frequency ranges and curve shapes may be varied according to design principles known in the art of signal filter design, the important feature relative to the present invention of all of these signal filters is that they each exhibit the signal filter skirt band frequency range wherein the intermediate fraction of the initial amplitude varies with the frequency of the introduced signal.

Figure 4:
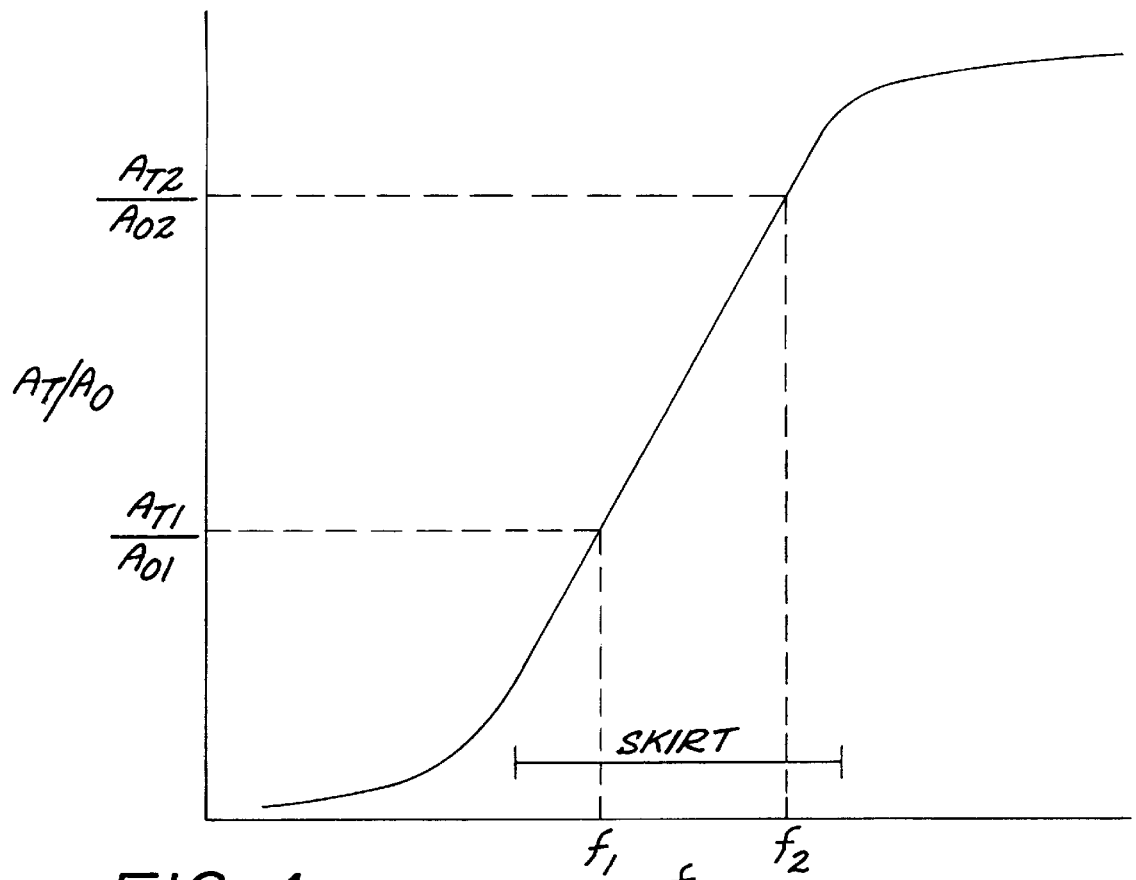
FIG. 4 is a schematic calibration diagram used in the invention.

The filter 42 is initially calibrated to determine the transmitted amplitude versus frequency curve within the signal filter skirt band frequency range, or at least a part thereof, with great accuracy, numeral 22. The calibration is essentially a highly accurate plot of the amplitude versus frequency curve, as shown in an example in FIG. 4. Preferably and as shown in FIG. 4, the curve is linear in all of the utilized portion of the skirt band frequency range, but the invention is operable even in the absence of linearity. The calibration curve is obtained by passing a succession of pure signals of different frequencies and of amplitudes $A_O$ through the filter, and measuring the resulting succession of transmitted amplitudes $A_T$. The resulting calibration relation, preferably presented as a normalized $A_T/A_O$ as a function of frequency f, may be expressed graphically, as a formula, or as a series of digitally stored points, but for convenience is termed a "calibration curve". The calibration curve may be obtained with great accuracy, because each data point is obtained with a pure input signal and a long sampling period to achieve high accuracy in the frequency data. The zero-crossing technique may be used to obtain the frequency value in each case during this calibration step. The calibration information is provided to step 32, to be discussed subsequently.

A test applied signal is provided, numeral 24, from a signal source 44. In the case of most interest to the inventor, the signal source 44 is a high-rate frequency hopping synthesizer operating in the gigahertz range (more than about 1 gigahertz but less than about 1000 gigahertz) for frequency hopping spread spectrum data communications. This frequency hopping signal source requires that highly accurate measurements of the frequency of the output signal be made in very short periods of time, such as about 50 microseconds in the case of a high-performance frequency hopping synthesizer operating in the gigahertz range.

The initial amplitude $A_O$ of the signal is determined, either by measurement or by assumption. Preferably, $A_O$ is measured by any operable apparatus 46, such as a Hewlett Packard 5347A Microwave Counter and Power Meter. If the test applied signal of the signal source 44 is of a known, highly accurate amplitude, that amplitude may be used as $A_O$.

The test applied signal is passed through the filter 42, numeral 28. Its transmitted amplitude $A_T$ is measured, numeral 30, preferably by the same type of apparatus 48 as used for the apparatus 46.

As part of the measurement of the transmitted amplitude, the normalized amplitude transmitted amplitude $A_T/A_O$ is usually obtained using a signal divider 50 with the values of $A_T$ and $A_O$. All further analysis is performed with this normalized information in order to avoid effects of changes in amplitude of the test applied signal.

Because the test applied signal lies within the signal filter skirt band frequency range, its associated frequency is as indicated on the calibration curve of FIG. 4. Because this unique relationship is known to exist, the normalized transmitted amplitude, $A_T/A_O$, may be used directly as an indicator of frequency. If the exact frequency value is required, it is found using the calibration relationship of FIG. 4, numeral 32. The calibration relation for the signal filter 42 is provided to step 32 from the calibration determination of step 22, which normally is performed at a different time than the frequency determination of the test applied signal.

Thus, by carefully selecting a particular filter 42 such that the frequency of the test applied signal lies within the signal filter skirt band frequency range of the filter 42 (or may be converted to lie within that range), the transmitted (normalized) amplitude of the filter is a direct measure of the frequency of the test applied signal.

The approximate frequency of the test applied signal is usually known a priori, and the present approach is used to determine that frequency exactly. If the approximate frequency is within the range of the skirt band, as illustrated in FIG. 4, it may be used directly. If, however, it is outside of the range of the skirt band, it may be upconverted or downconverted, numeral 26, so that the converted frequency lies within the range of the skirt band. Highly accurate upconversion and downconversion techniques and apparatus are known in the art.

Figure 5:
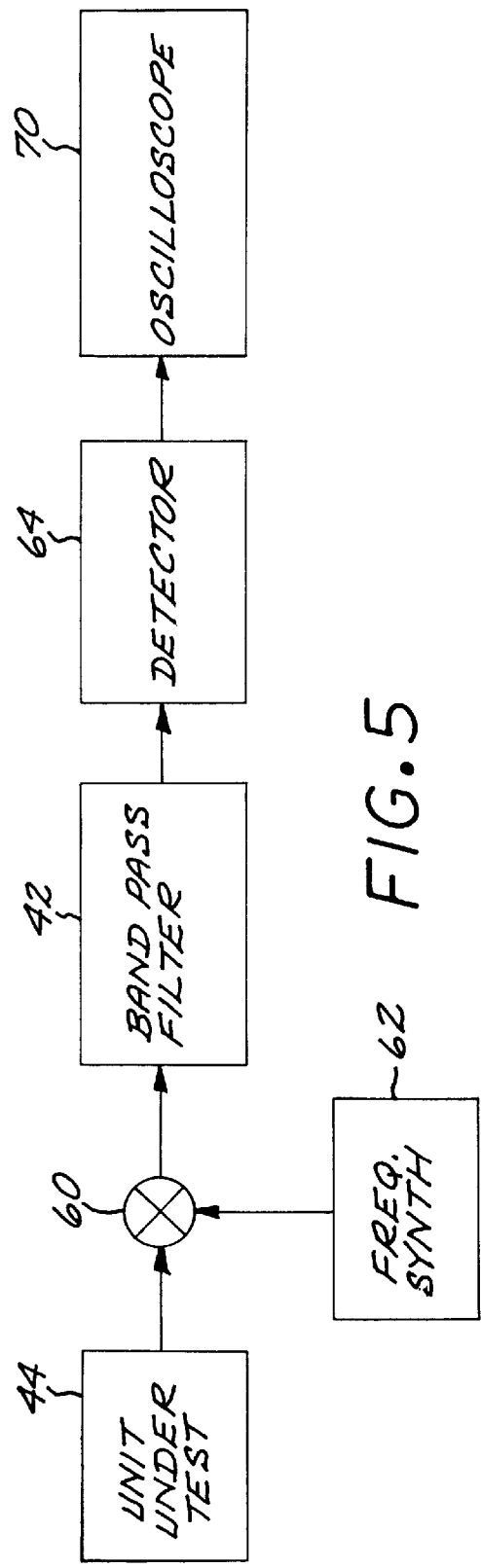
FIG. 5 is a block diagram of a second apparatus for practicing the present invention.
Figure 6:
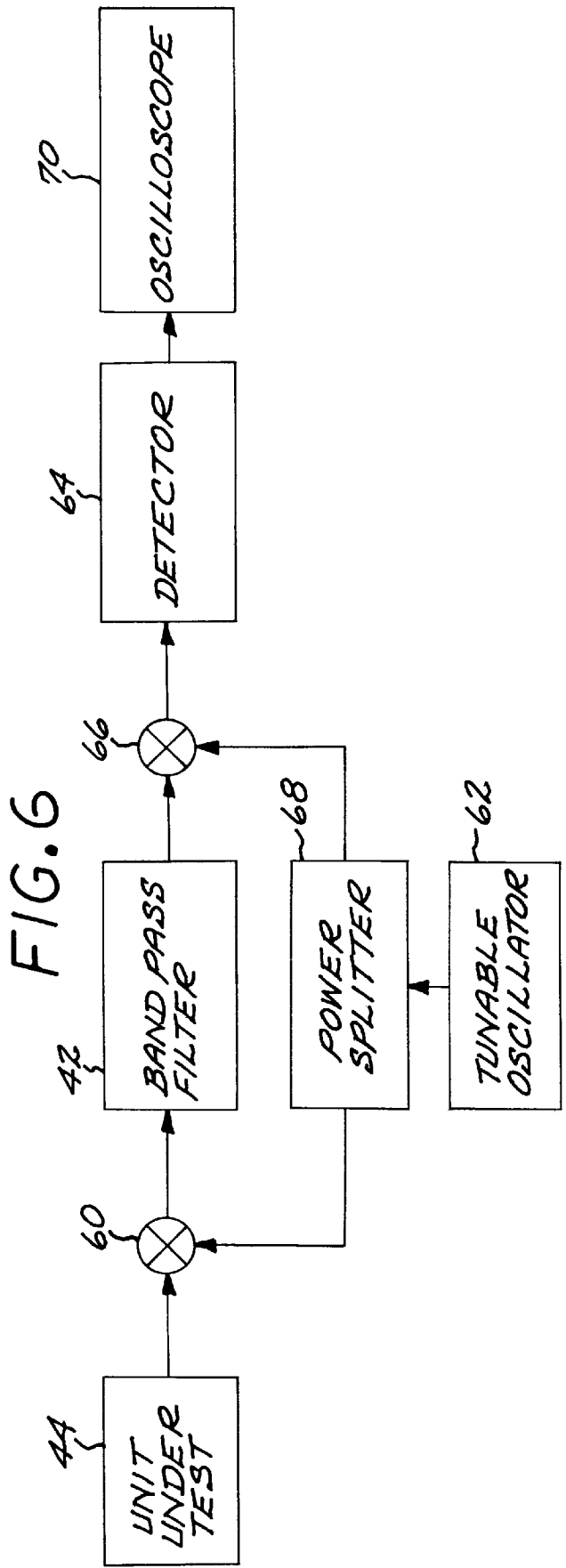
FIG. 6 is a block diagram of a third apparatus for practicing the present invention.

FIGS. 5 and 6 illustrate two embodiments of apparatus for performing the frequency measurements according to the present approach, each including a frequency conversion capability. An initial signal in each case is provided from the source 44. It is mixed by a frequency mixer 60 with a synthesized frequency from a pure, steady mixing frequency source 62, to produce a test applied signal that is within the filter skirt band of the selected signal filter 42. The mixed signal is passed through the signal filter 42. In the case of the apparatus of FIG. 5, the filtered signal is introduced directly into an amplitude detector 64 of any operable type. In the case of the apparatus of FIG. 6, the filtered signal is de-mixed by a frequency demixer 66 operating with the same synthesized frequency as the frequency mixer 60, and which was split from the signal to the frequency mixer 60 by a power splitter 68. This mixing/demixing technique is termed a Wadley Loop Filter. The difference in result between the approaches of FIGS. 5 and 6 is that the detector 64 in FIG. 5 operates on the mixed signal having a frequency within the filter skirt band, and the detector 64 in FIG. 6 operates on the signal having the original frequency of the mixing frequency source 62. The resulting amplitude information is used in the manner discussed previously, and may be conveniently depicted on an oscilloscope 70.

Figure 7:
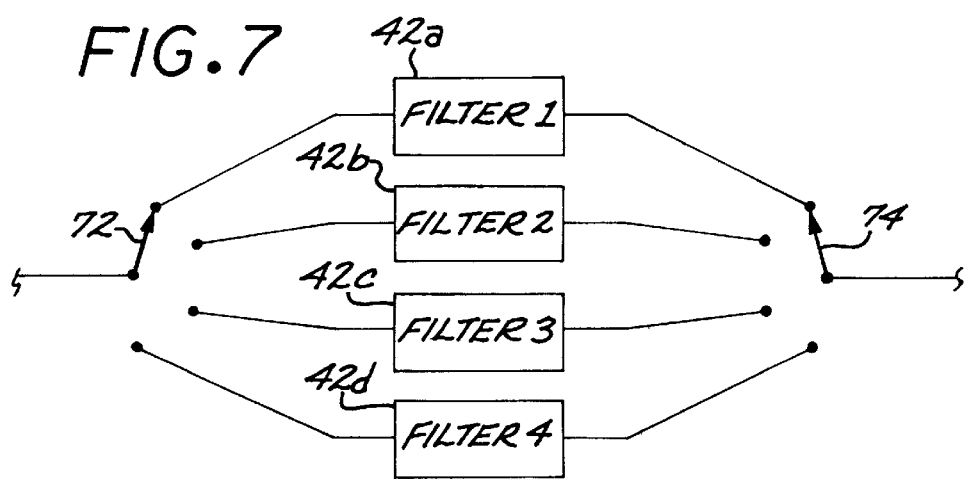
FIG. 7 is a block diagram of a switched filter bank.

An alternative approach to handling a wide range of possible frequencies of the test applied signal is illustrated in FIG. 7. A number of filters 42, illustrated as four filters 42a–42d, collectively having their signal filter skirt band frequency ranges covering a wide range of frequencies, may be provided and the inputs and outputs switched between them by respective switches 72 and 74. This filter bank would be positioned at the location of element 42 in FIGS. 2, 5, or 6, with the upstream and downstream elements unchanged. The filter bank may be used with the unmixed signal approach of FIG. 2, or with the mixed frequency approach of FIGS. 5–6.

The present approach is particularly effective when used to accurately measure the difference in frequency between two signals, each of which has a frequency lying within the signal filter skirt band. In this approach, a first test applied signal and a second test applied signal are sequentially introduced into the signal filter. The difference in amplitude between the two test applied signals is measured as an indicator of the frequency difference between the first test applied signal and the second test applied signal. If the frequency of one of the two signals is a reference value that is known with great accuracy, as where it is produced by a highly stable synthesizer, the frequency of the other test applied signal may also be determined with great accuracy using this approach.

Figure 8:
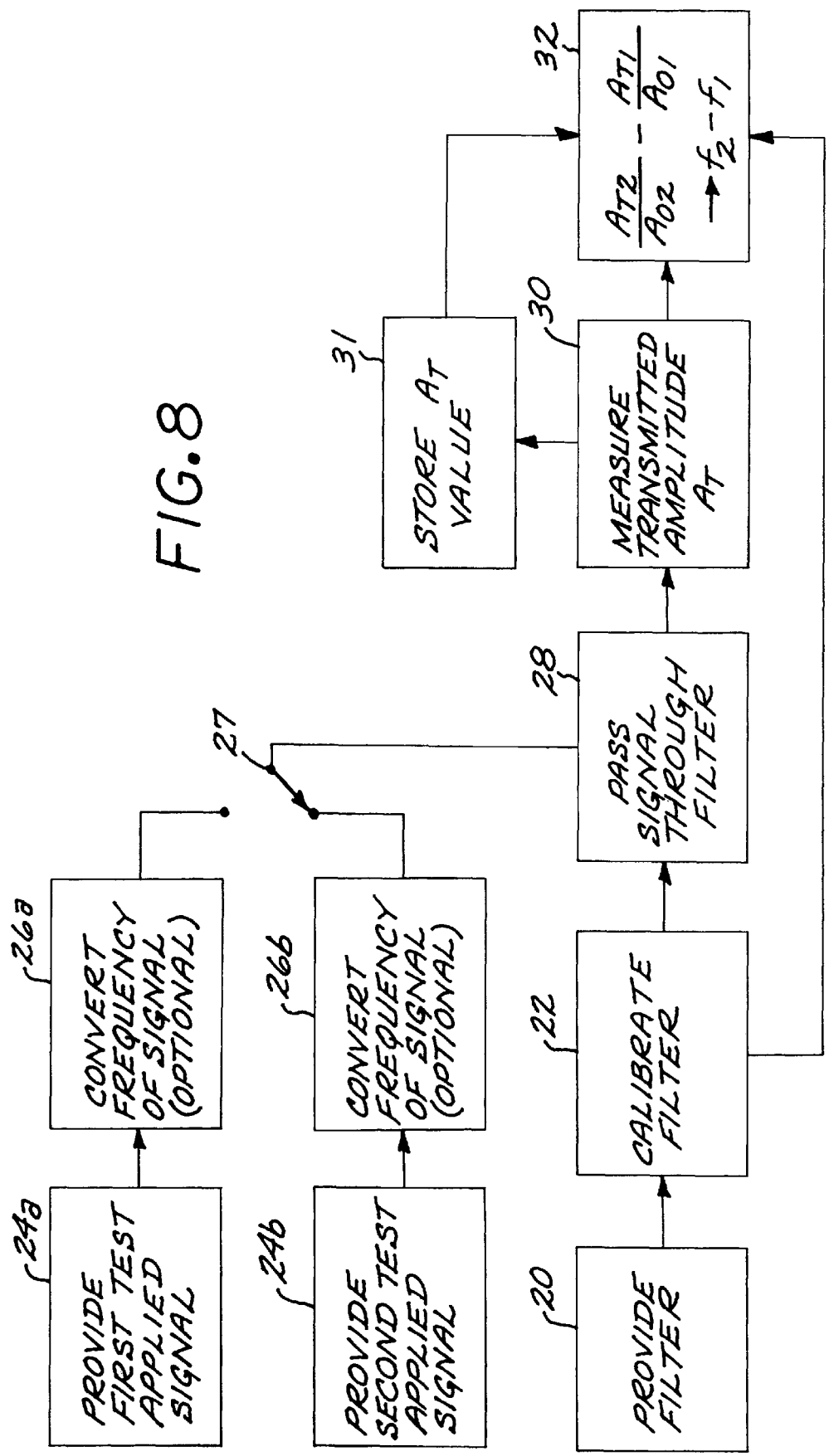
FIG. 8 is a block flow diagram of a preferred approach for differential frequency measurements using the present invention.

FIG. 8 illustrates the method for such a determination, using substantially the same apparatus as in FIGS. 2, 5, or 6, but with the addition of a high-speed switch and a memory. In FIG. 8, many of the same elements described above in relation to FIG. 1 are used and the same numerical identifiers applied, and those descriptions are incorporated here. The differences in the two approaches are described next.

In the differential frequency method of FIG. 8, a first test applied signal and a second test applied signal are successively passed through the filter using a high speed switch 27. The normalized transmitted amplitude of the first test applied signal, $A_{T1}/A_{O1}$, is determined and stored in a memory 31. The normalized amplitude of the second test applied signal, $A_{T2}/A_{O2}$, is thereafter determined following operation of the switch 27. The frequency difference determination, numeral 32, operates using the difference in these normalized amplitudes, $(A_{T2}/A_{O2})-(A_{T1}/A_{O1})$ to determine the difference in frequencies $(f_2-f_1)$ as pictured in FIG. 4.

The difference in frequencies $(f_2-f_1)$ may be useful for many applications, where exact values of $f_2$ and $f_1$ are not known and need not be known. The exact value of a first one of these frequencies may be determined if the other is known accurately, as, for example, where the second one is a known reference frequency from a highly accurate reference source. For example, if $f_2$ is such a reference frequency and $f_1$ is the output of the variable frequency source such as the previously discussed high-rate frequency-hopping synthesizer, this difference method allows the highly accurate determination of the numerical value of the frequency of the output of the frequency hopping synthesizer. This determination is facilitated where the calibration curve of FIG. 4 is linear, because the frequency difference is a linear function of the normalized amplitude difference. Some nonlinear calibration curves may also be used. The present approach may be utilized with any monotonically increasing or decreasing segment of such a nonlinear calibration curve.

An apparatus like that of FIG. 5 was assembled to determine frequencies of output signals from a frequency hopping synthesizer operating in the 12.5–13.5 gigahertz frequency range, with each dwell between hops being about 50 microseconds in duration. A Hewlett Packard spectrum analyzer was used to tune the mixing frequency source 62 to the correct value so that the signal reaching the filter 42 would lie within the skirt frequency range. A 10 KHz wide Gaussian bandpass signal filter 42 was used and calibrated in the manner described. The measured amplitudes made in 50 microseconds resulted in determinations of frequencies to within about ±50 Hertz. By comparison, a commercially available, state-of-the-art Hewlett Packard 5345A frequency counter produced accuracies of about ±5000 Hertz in the same 50 microsecond sampling period. The present approach thus achieves two orders of magnitude improvement in accuracy of the measurement, as compared with the commercially available instrument.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for finding the frequency of a test applied signal, comprising the steps of
providing a signal filter having, as a function of frequency,
a signal pass band frequency range wherein a high fraction of an initial amplitude of an introduced signal passes through the signal filter,
a signal stop band frequency range wherein a low fraction of the initial amplitude of the introduced signal passes through the signal filter, and
a signal filter skirt band frequency range between the signal pass band and the signal stop band, wherein an intermediate fraction of the initial amplitude of the introduced signal passes through the signal filter, the intermediate fraction varying with the frequency of the introduced signal;
introducing the test applied signal into the signal filter, the test applied signal having a frequency which lies within the signal filter skirt band frequency range;
measuring the a transmitted amplitude of the test applied signal after the test applied signal has passed through the signal filter; and
utilizing a transmitted amplitude as an indicator of the frequency of the test applied signal, wherein the step of utilizing includes the steps of
establishing a signal filter calibration relation of the amplitude of a transmitted signal in the signal filter skirt band as a function of the frequency of an applied signal, and
determining the frequency of the test applied signal from the amplitude of the test applied signal and the signal filter calibration relation.

2. The method of claim 1, wherein the step of establishing a signal filter calibration relation includes the step of
establishing the slope of the amplitude versus frequency relationship of the signal filter.

3. The method of claim 1, wherein the signal filter is a band-pass filter.

4. The method of claim 1, wherein the signal filter is a low pass filter.

5. The method of claim 1, wherein the signal filter is a high pass filter.

6. The method of claim 1, wherein the signal filter is a band reject filter.

7. The method of claim 1, wherein the signal filter is an electrical filter, and the test applied signal is an electrical signal.

8. The method of claim 1, wherein the test applied signal has a frequency of more than about 1 gigahertz and less than about, 1000 gigahertz.

9. A method for finding the frequency of a test applied signal, comprising the steps of
providing a signal filter having, as a function of frequency,
a signal pass band frequency range wherein a high fraction of an initial amplitude of an introduced signal passes through the signal filter,
a signal stop band frequency range wherein a low fraction of the initial amplitude of the introduced signal passes through the signal filter, and
a signal filter skirt band frequency range between the signal pass band and the signal stop band, wherein an intermediate fraction of the initial amplitude of the introduced signal passes through the signal filter, the intermediate fraction varying with the frequency of the introduced signal;

introducing the test applied signal into the signal filter, the test applied signal having a frequency which lies within the signal filter skirt band frequency range, wherein the step of introducing a test applied signal includes the steps of providing a frequency hopping signal synthesizer, and introducing signals from the frequency hopping signal synthesizer into the signal filter;

measuring a transmitted amplitude of the test applied signal after the test applied signal has passed through the signal filter; and utilizing the transmmitter amplitude as an indicator of the frequency of the test applied signal.

10. The method of claim 9, wherein the step of utilizing includes the steps of establishing a signal calibration relation of the amplitude of a transmitted signal in the signal filter skirt band as a funtion of the frequency of an applied signal; and determining the frequency of the test applied signal from the amplitude of the test applied signal and the signal filter calibration relation.

11. The method of claim 9, wherein the step of introducing a test applied signal includes the step of providing a test initial signal whose frequency is not within the signal filter skirt band, and processing the test initial signal with a known frequency shift so that the resulting signal is the test applied signal within the signal filter skirt band.

12. A method for finding the frequency of a test applied signal, comprising the steps of providing a signal filter having, as a function of frequency,
a signal pass band frequency range wherein a high fraction of an initial amplitude of an introduced signal passes through the signal filter,
a signal stop band frequency range wherein a low fraction of the initial amplitude of the introduced signal passes through the signal filter, and
a signal filter skirt band frequency range between the signal pass band and the signal stop band, wherein an intermediate fraction of the initial amplitude of the introduced signal passes through the signal filter, the intermediate fraction varying with the frequency of the introduced signal;

introducing a reference applied signal into the signal filter, the reference applied signal having a frequency which lies within the signal filter skirt band frequency range;

measuring a transmitted amplitude of the reference applied signal after the reference applied signal has passed through the signal filter;

introducing the test applied signal into the signal filter, the test applied signal having a frequency which lies within the signal filter skirt band frequency range;

measuring the transmitted amplitude of the test applied signal after the test applied signal has passed through the signal filter; and utilizing the transmitted amplitude of the test applied signal as an indicator of the frequency of the test applied signal, the step of utilizing including the step of comparing the transmitted amplitude of the test applied signal with the transmitted amplitude of the reference applied signal as an indicator of the frequency difference between the test applied signal and the reference applied signal.

13. The method of claim 12, wherein the step of utilizing includes the steps of establishing a signal filter calibration relation of the amplitude of a transmitted signal in the signal filter skirt band as a function of the frequency of an applied signal; and determining the frequency of the test applied signal from the transmitted amplitude of the test applied signal and the signal filter calibration relation.

14. The method of claim 12, wherein the step of introducing a test applied signal includes the step of providing a test initial signal whose frequency is not within the signal filter skirt band, and processing the test initial signal with a known frequency shift so that the resulting signal is the test applied signal within the signal filter skirt band.

15. A method for finding the frequency of a test applied signal, comprising the steps of providing a signal filter having as a function of frequency,
a signal pass band frequency range wherein a high fraction of an initial amplitude of an introduced signal passes through the signal filter,
a signal stop band frequency range wherein a low fraction of the initial amplitude of the introduced signal passes through the signal filter, and
a signal filter skirt band frequency range between the signal pass band and the signal stop band, wherein an intermediate fraction of the initial amplitude of the introduced signal passes through the signal filter, the intermediate fraction varying with the frequency of the introduced signal;

introducing the test applied signal into the signal filter, the test applied signal having a frequency which lies within the signal filter skirt band frequency range, wherein the step of introducing a test applied signal includes the steps of providing a test initial signal whose frequency is not within the signal filter skirt band, and processing the test initial signal with a known frequency shift so that the resulting signal is the test applied signal within the signal filter skirt band;

measuring a transmitted amplitude of the test applied signal after the test applied signal has passed through the signal filter; and utilizing the amplitude as an indicator of the frequency of the test applied signal.

16. The method of claim 15, wherein the step of utilizing includes the steps of establishing a signal filter calibration relation of the amplitude of a transmitted signal in the signal filter skirt band as a function of the frequency of an applied signal; and determining the frequency of the test applied signal from the amplitude of the test applied signal and the signal filter calibration relation.

17. A method for rapidly finding the frequency relationship of a first applied signal and a second applied signal, the method comprising the steps of providing a signal filter having, as a function of frequency,
a signal pass band frequency range wherein a high fraction of an initial amplitude of an introduced signal passes through the signal filter, a signal stop band frequency range wherein a low fraction of the initial amplitude of the introduced signal passes through the signal filter, and a signal filter skirt band frequency range between the signal pass band and the signal stop band, wherein an intermediate fraction of the initial amplitude of the introduced signal passes through filter, the intermediate fraction varying with the frequency of the introduced signal;

establish a transmitted amplitude versus frequency calibration relationship for the signal filter in the signal filter skirt band;

sequentially introducing the first test applied signal and the second test applied signal into the signal filter, each of the first test applied signal and the second test applied signal having a frequency lying within the signal filter skirt band; and measuring a transmitted amplitude of the first test applied signal relative to a transmitted amplitude of the second test applied signal as an indicator of the frequency difference between the first test applied signal and the second test applied signal.

18. The method of claim 17, wherein the step of sequentially introducing includes the step of providing a frequency hopping signal synthesizer, and introducing signals from the frequency hopping signal synthesizer into the signal filter.

19. The method of claim 17, wherein the step of sequentially introducing includes the step of providing at least one test initial signal whose frequency is not within the signal filter skirt band, and processing the test initial signal with a known frequency shift so that the resulting signal is the test applied signal within the signal filter skirt band.

20. The method of claim 17 wherein the second test applied signal is a reference signal of a known frequency.

* * * * *